(12) United States Patent
Marino et al.

(10) Patent No.: US 8,835,988 B2
(45) Date of Patent: Sep. 16, 2014

(54) HYBRID MONOLITHIC INTEGRATION

(75) Inventors: Fabio Alessio Marino, San Jose, CA (US); Paolo Menegoli, San Jose, CA (US)

(73) Assignee: Eta Semiconductor Inc., San Jose, CA (US)

( * ) Notice: Subject to any disclaimer, the term of this patent is extended or adjusted under 35 U.S.C. 154(b) by 0 days.

(21) Appl. No.: 13/488,398

(22) Filed: Jun. 4, 2012

(65) Prior Publication Data

US 2012/0305992 A1    Dec. 6, 2012

Related U.S. Application Data

(60) Provisional application No. 61/520,041, filed on Jun. 6, 2011.

(51) Int. Cl.
| | |
|---|---|
| *H01L 29/78* | (2006.01) |
| *H01L 21/02* | (2006.01) |
| *H01L 27/06* | (2006.01) |
| *H01L 27/092* | (2006.01) |
| *H01L 29/778* | (2006.01) |
| *H01L 21/8258* | (2006.01) |
| *H01L 29/20* | (2006.01) |

(52) U.S. Cl.
CPC ............ *H01L 21/0243* (2013.01); *H01L 29/78* (2013.01); *H01L 21/0254* (2013.01); *H01L 21/0245* (2013.01); *H01L 29/2003* (2013.01); *H01L 21/02546* (2013.01); *H01L 27/0605* (2013.01); *H01L 27/092* (2013.01); *H01L 21/02494* (2013.01); *H01L 29/7787* (2013.01); *H01L 21/8258* (2013.01); *H01L 21/02381* (2013.01); *H01L 21/02458* (2013.01); *H01L 21/02472* (2013.01)
USPC .................................. 257/200; 257/E29.068

(58) Field of Classification Search
CPC ..................... H01L 29/2003; H01L 29/66462; H01L 29/7787; H01L 29/66431; H01L 29/778
USPC ......................................................... 257/200
See application file for complete search history.

(56) References Cited

U.S. PATENT DOCUMENTS

| | | | |
|---|---|---|---|
| 2006/0284247 A1 | 12/2006 | Augustine et al. | |
| 2010/0140663 A1* | 6/2010 | Hopper et al. | ................ 257/194 |
| 2011/0108850 A1 | 5/2011 | Cheng et al. | |

* cited by examiner

*Primary Examiner* — Tony Tran (57) ABSTRACT

The present invention describes a hybrid integrated circuit comprising both CMOS and III-V devices, monolithically integrated in a single chip. It allows the almost complete elimination of the contamination issues related to the integration of different technologies, maintaining at the same time a good planarization of the structure. It further simplifies the fabrication process, allowing the growth of high quality III-V materials on (100) silicon substrates lowering the manufacturing cost. Moreover, differently from many prior art attempts, it does not require silicon on insulator technologies and/or other expensive process steps. This invention enables the consolidation on the same integrated circuit of a hybrid switching power converter that takes advantage of the established circuit topologies of CMOS circuitries and of the higher mobility and voltage withstanding of III-V HEMT devices.

5 Claims, 7 Drawing Sheets

HYBRID MONOLITHIC INTEGRATION

RELATED APPLICATION DATA

The present application claims priority from U.S. Provisional Patent Application No. 61/520,041 for "Hybrid monolithic integration" filed on Jun. 6, 2011.

BACKGROUND OF THE INVENTION

1. Field of the Invention

The present invention is in the field of semiconductor structures. The present invention is further in the field of semiconductor structures of transistor devices and manufacture processes. The present invention further relates to the field of integrated devices and circuits. The implementation is not limited to a specific technology, and applies to either the invention as an individual component or to inclusion of the present invention within larger systems which may be combined into larger integrated circuits.

2. Brief Description of Related Art

Silicon and III-V materials IC technologies are traditionally distinguished by their unique and often exclusive characteristics. While Si technology is more mature and uses more established processes that enable a much higher level of integration, its device speed is relatively limited. III-V based technologies, such as Gallium Arsenide (GaAs) and Gallium Nitride (GaN), on the other hand, offer much faster device speed as well as light-emitting capability. However, III-V compounds semiconductors suffer from extreme sensitivity to processing and a lack of established processes, limiting the circuit integration to much lower levels than for Si IC's.

III-V compounds based devices such as Light Emitting Diodes (LED) and High Electron Mobility Transistors (HEMTs) are usually grown on sapphire ($Al_2O_3$), silicon carbide (SiC) or Germanium (Ge) substrates depending on the physical properties of the III-V crystal. Nevertheless, the growth of device-quality III-V based hetero-structures on silicon substrates is of huge interest in terms of cost, availability, processing and integration. Hybrid circuits are promising candidates for use in power applications as well as for optical applications. Examples hereof include the manufacture of light emitting diodes, power amplifiers, power converters, etc. In particular, high frequency power converter and RF applications can greatly benefit from the use of these new type of integrated circuits.

Hexagonal GaN, for instance, has been already successfully deposited on Si (111) substrates either by metal-organic chemical vapor deposition (MOCVD) or by molecular beam epitaxy (MBE) methods, in spite of the difficulties related to the very high reactivity of the silicon surface with nitrogen, the large lattice mismatch (−16.2%) and the large difference in thermal expansion coefficient (113%). However, from the point of view of integrating GaN devices with silicon technology, the Si (100) substrate is preferred because it is the most widely used in silicon mainstream technology. Generally however, a mixture of cubic and hexagonal GaN tends to grow on Si (100) substrate, with the cubic poly-type being the dominant phase, which significantly decreases the device performance.

The main difficulty in growing GaN on Si is the stress that develops during growth. Cracks occur even for epi-layer thickness of about 1 um. Therefore, to obtain GaN based devices, it is important to minimize the strain. For optoelectronic devices, a thick layer with good electro-optical and structural properties is required and these are also the basic criteria for transistors. Also, to achieve high carrier mobility the interface should be defect free, abrupt and smooth. This is achievable only for epitaxial-layers well above 1 um in thickness.

Patterning substrates by masking or etching the substrates or buffer layers are low cost but highly effective ways to reduce the stress or cracks. Dislocations or cracks will be guided in the masked or etched layer and will leave the epitaxial layer with low density of dislocations or cracks. In this technique, a Silicon Nitride ($Si_3N_4$) or a Silicon Dioxide ($SiO_2$) layer is deposited over the Silicon substrate in a patterned manner or deep trenches are made on the masked materials. The exposed surfaces are usually misoriented from the 100 substrate in order to improve the crystal quality and therefore the performance of the III-V based devices.

Some previous work suggests that, for example, the use of Si (100) substrates tilted by more than 4° towards [011] is effective to prevent the formation of two domains during the growth of AlN and GaN. By enabling the growth of a pure hexagonal GaN layer similar results were obtained for the growth of GaAs on Si wafers misoriented from the singular plane (001) by 4-6 arc degrees. Using a misorientation of about 54 degrees, the compound material can be also grown directly on the (111) Si direction, significantly improving the crystal quality.

An example of this technique is reported in Hopper at al. (US 2010/0140663) where the manufacturing of a discrete AlGaN/GaN HEMT formed on a <100> orientation silicon wafer is described. In this patent application, the authors use a trench with walls slanted at 54 degrees etched into the silicon to provide a <111> orientation substrate surface for forming the AlGaN channel transistor.

The growth of purely hexagonal GaN on Si (100) Substrates can be achieved also by employing one sputtered aluminum nitride (AlN) buffer layer followed by another high-temperature MOCVD grown AlN buffer layer. An AlGaN buffer layer can be also added over the AlN seed layer in order to improve the quality of the GaN crystal. The AlGaN layer increases the series resistance and generates compressive stresses in the GaN layer, which helps reduce cracks in the layer and provides good electrical insulation from the substrates. So the efficiency of high frequency transistors and vertically contacted LEDs will increase.

Another potential advantageous buffer material is the Zinc Oxide (ZnO), which is isomorphic with wurtzite GaN, with only 1.8% lattice mismatch with respect to GaN. In fact, they have already been used as buffer layers for each other. Chemical Vapor Deposition (CVD), and Molecular Beam Epitaxy (MBE), have been utilized to grow ZnO-buffered GaN films on various substrates. Particularly high-quality GaN films on ZnO have been obtained through an ion-beam-assisted filtered cathodic vacuum arc (I-FCVA) technique. This technique offers several advantages as it is versatile, more flexible, and more cost effective than the most widely used MOCVD and MBE techniques. The FCVA technique employs a curved magnetic field to guide the plasma generated from the cathodic vacuum arc to deposit on substrates, using a mechanical filtering technique to remove unwanted macroparticles and neutral atoms. Only ions within a defined energy range reach the substrates, thus producing films with good controllability and reproducibility. On the other hand, the ion beam source can generate energetic nitrogen ions from nitrogen gas, which effectively enhances the formation of the GaN.

Other very good techniques to grow a III-V layer on Silicon substrate comprise Pulsed laser deposition (PLD) and Pulsed Plasma Deposition (PPD) techniques. PLD is a thin film deposition (specifically a physical vapor deposition, PVD)

technique where a high power pulsed laser beam is focused inside a vacuum chamber to strike a target of the material that is to be deposited. This material is vaporized from the target (in a plasma plume) which deposits it as a thin film on a substrate (such as a silicon wafer facing the target). This process can occur in ultra high vacuum or in the presence of a background gas.

While the basic setup is simple relative to many other deposition techniques, the physical phenomena of laser-target interaction and film growth are quite complex. When the laser pulse is absorbed by the target, energy is first converted to electronic excitation and then into thermal, chemical and mechanical energy resulting in evaporation, ablation, plasma formation and even exfoliation. The ejected species expand into the surrounding vacuum in the form of a plume containing many energetic species including atoms, molecules, electrons, ions, clusters, particulates and molten globules, before depositing on the typically hot substrate.

PPD is a low temperature processes physical vapor deposition technique proved to deposit thin films of numerous materials such as oxides, complex oxides, nitrides, carbides, carbon based films, semiconductors, etc. PPD produces a pulsed high density electron beam (500 MW/cm$^2$) which, by interacting with the target, causes material ablation independently of the energy gap (i.e. the optical absorption) of the target itself. The chemical composition of the target is transferred to the substrate by a supersonic highly energetic plasma giving rise to thin films of materials otherwise impossible to grow with conventional PVD and CVD techniques.

In general, also the co-integration of other III-V materials, such as GaAs, with CMOS IC present the same issued discussed above in particular for GaN technologies. There have been many studies of alternative growth approaches (MBE, MOCVD, etc.), as well as different procedures used within each general deposition approach, to minimize defect densities and cross-contaminations between the two technologies. Despite these many studies, the high risk of cross-contamination and the defect density limit the manufacture of hybrid integrated circuits. There are indeed many issues associated with the thermal budget of the combined processes and with the quality of the III-V epitaxial layers, which has not been solved yet.

An example of co-integration of III-V materials with a standard CMOS technology is reported in Augustine et al. in (US 2006/0284247), where the authors disclose the integration of AlGaN/GaN amplifiers with silicon CMOS circuits. A planarization layer of amorphous or polycrystalline silicon and a thin layer of single crystalline silicon were formed on a SiC substrate. Thereafter, a GaN heterostructure comprising AlGaN and GaN layers was grown epitaxially. A protection layer of silicon nitride or silicon oxide was deposited on the GaN heterostructure. Following this, a silicon layer is bonded to the protection layer particularly in the form of an SOI substrate with its top layer bonded to the passivation layer. The SOI substrate is thereafter thinned so as to remove its handling wafer and its buried oxide. The resulting silicon device layer typically has a thickness of 50 to 200 nm. A first device area for the definition of GaN devices was defined, and the silicon is etched away in those areas. Following this, CMOS devices are fabricated on the silicon layer in a second device area, and GaN devices are fabricated on the GaN hetero structure.

Even if this method enables the co-integration of two different technologies, it has the disadvantage that the bonding process is still delicate, and may not result in a strong bond. Furthermore, it preferably applies grooves into one or more of the layers at the bonding interface so as to remove residual gases from the interface. These grooves are particularly needed at the center of the wafer, where otherwise the bond would not be good enough. The grooves are typically at a pitch between 1 and 2 um. This however implies that the pitches will be present within the final chip, and thus the amount of available surface area decreases.

An interesting solution to this problem has been proposed by Cheng et al. (US 2011/0108850), where a substrate for hybrid integrated circuits comprising both GaN and Si devices, is disclosed. This substrate comprises a GaN-heterostructure in a first device area for definition of GaN-based devices, which hetero-structure is covered partially with a protection layer; and a semiconductor substrate layer in a second device area for definition of CMOS devices. The GaN heterostructure and the semiconductor substrate layer are provided in one trench in the substrate, so that the GaN heterostructure and the semiconductor substrate layer are laterally juxtaposed.

Even if this solution has the advantage that the integrated semiconductor substrate structure may be provided with a substantially planarized surface, it still does not solve the problem related to the different thermal budgets needed for the III-V process and the CMOS devices. In this patent application, the authors indeed disclose the fabrication of a semiconductor substrate containing a GaN heterostructure which should be utilized to process the CMOS technology. The high temperature annealing steps required from the CMOS process could lead to the diffusion of Silicon atoms in the GaN layer, decreasing the GaN-based device performances.

The prior art attempts described above have therefore several drawbacks and are not industrially viable. It is indeed desirable to provide an improved hybrid integrated circuit which is not sensitive to diffusion of silicon and/or oxide particles into the GaN layers. It is also desirable to provide an improved method for the manufacturing of this integrated semiconductor structure in which III-V devices can be defined in at least a first device area and on which CMOS circuits can be defined in a separate area, preventing the cross contaminations of the two or more processes due to the different thermal budget of the technologies used. It is also desirable to provide an improved method of manufacturing an integrated circuit with both III-V and CMOS devices and to provide improved devices.

It is therefore a purpose of the present invention to describe a novel hybrid integrated circuit that offers the advantage of combining different semiconductor technologies with high density, reducing semiconductor area and cost combined with improved performances in terms of on resistance and frequency response.

This invention enables the consolidation on the same integrated circuit of a hybrid switching power converter that takes advantage of the established circuit topologies of CMOS circuitries and of the higher mobility and voltage withstanding of III-V HEMT devices.

SUMMARY OF THE INVENTION

The present invention describes a hybrid integrated circuit comprising both Silicon CMOS and III-V devices, monolithically integrated in a single chip. It allows the almost complete elimination of the contamination issues related to the integration of the different technologies, maintaining at the same time a good planarization of the structure. It further simplify the fabrication process, allowing the growth of high quality III-V materials on (100) silicon substrates lowering the manufacturing cost. Moreover, differently from many prior art attempts, it does not require silicon on insulator technologies and/or other expensive process steps.

In order to better understand this concept, let us consider a power converter where the control circuitry is fabricated in standard CMOS process technology, whereas the output stage is realized by using two AlGaN/GaN HEMT in III-Nitride technology. In the present invention, the CMOS circuitry is fabricated using a conventional CMOS process. Just before the metallization step, a protective layer of Silicon Nitride—SiN (or others insulating materials) is deposited all over the wafer. At this point the semiconductor area, where the power HEMTs will be formed, can be etched removing selectively the SiN passivation layer and a portion of the silicon substrate.

Is it possible, utilizing a low temperature deposition process, such as Plasma Laser Deposition (PLD) or Pulsed Plasma Deposition (PPD), to form a buffer layer of ZnO or AlN, which will allow the formation of a high quality GaN layer. Once the buffer layer is formed, the GaN, and sequentially the AlGaN barrier layer, can be deposited on the exposed surface. Through other etching process steps, the extra layers of ZnO and GaN/AlGaN over the CMOS circuit can be finally removed, obtaining a high planarized integrated circuit. The metallizations can be then formed without altering the device performance (i.e. without adding unnecessary parasitic resistance due to multilevel configurations).

Figure 1:
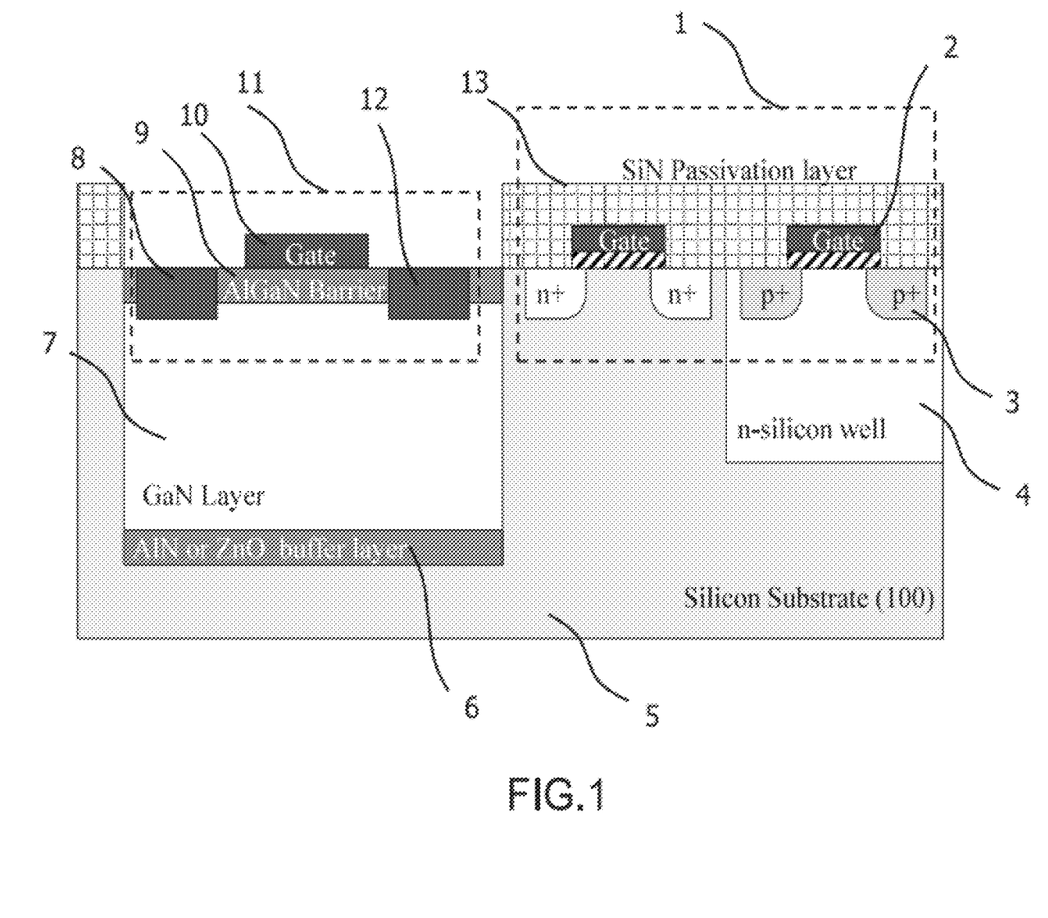
FIG. 1 shows a cross section view of a hybrid integrated circuit according to a first embodiment of the invention.
Figure 2:
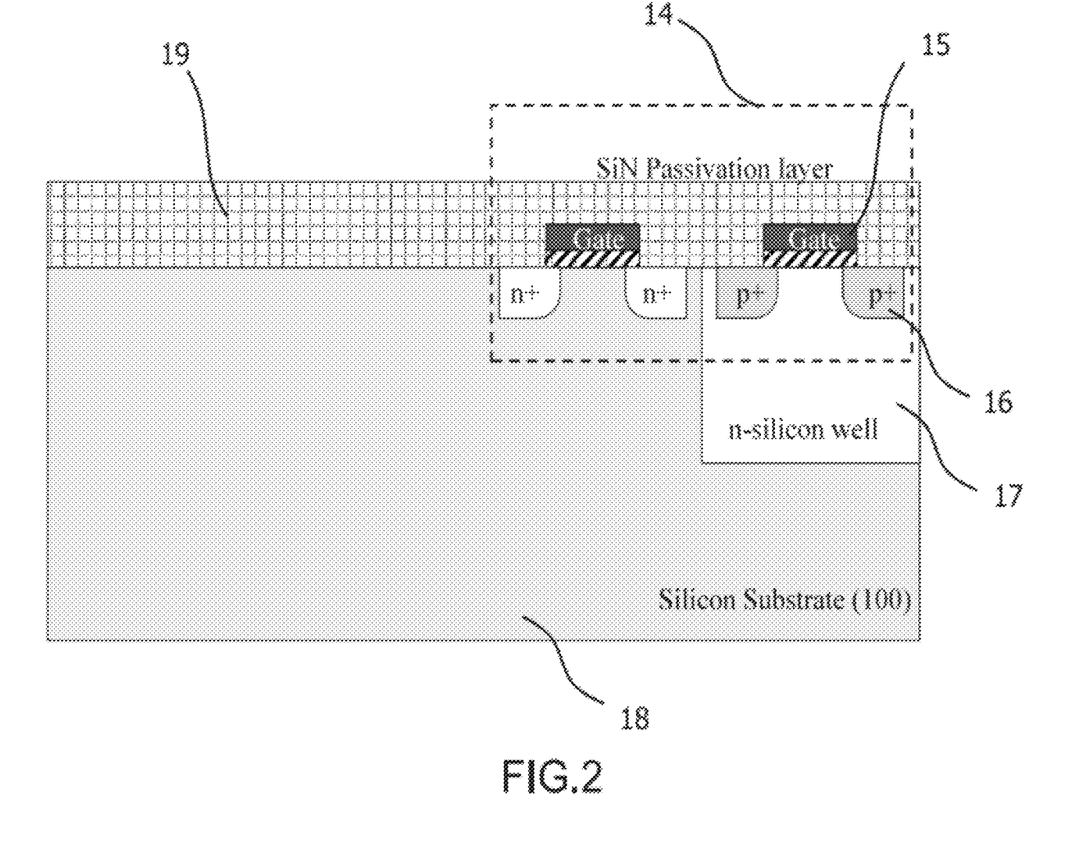
FIG. 2 shows a cross section view of a hybrid integrated circuit during the fabrication process, after the CMOS passivation has been executed.

An example of this approach is illustrated in FIG. 1, where a CMOS circuit and a GaN HEMT are co-integrated in the same silicon wafer. In FIG. 2 is reported a schematized cross-section of the wafer after the SiN passivation, whereas in FIG. 3 a SiN etch, and sequentially a silicon etch have been performed forming the trench that will hold the HEMT device.

Figure 3:
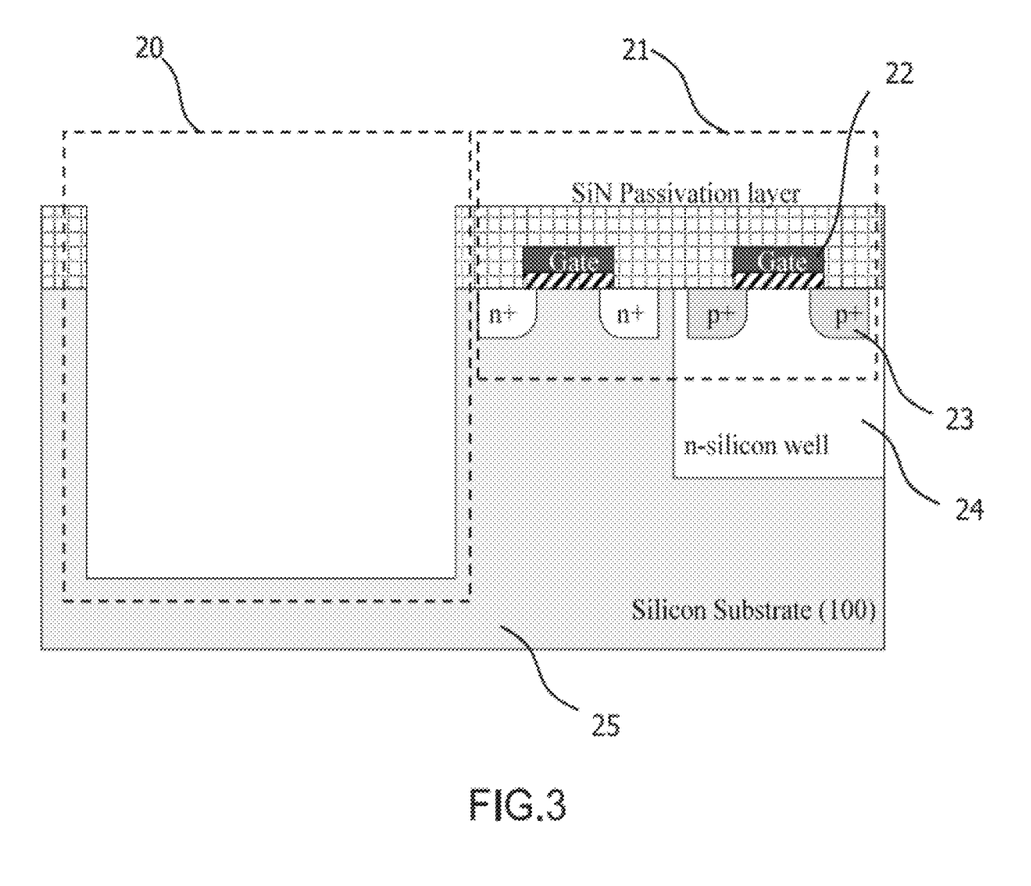
FIG. 3 shows a cross section view of a hybrid integrated circuit during the fabrication process, after a silicon trench has been formed in the substrate in order to accommodate the III-V material.

Since the formation of the GaN layer 7 is performed at low temperatures, such as less than 600° C., and only after the CMOS devices 1 have been passivated, no cross-contaminations between the two processes can take place, resulting in a net improvement of the device performance. GaN films can indeed be grown with their c-axis or a-axis perpendicular to the Si substrate surface by tuning the deposition conditions, which allows the growth of textured GaN films with either polar (c-plane) or nonpolar (m-plane) surfaces.

Figure 4:
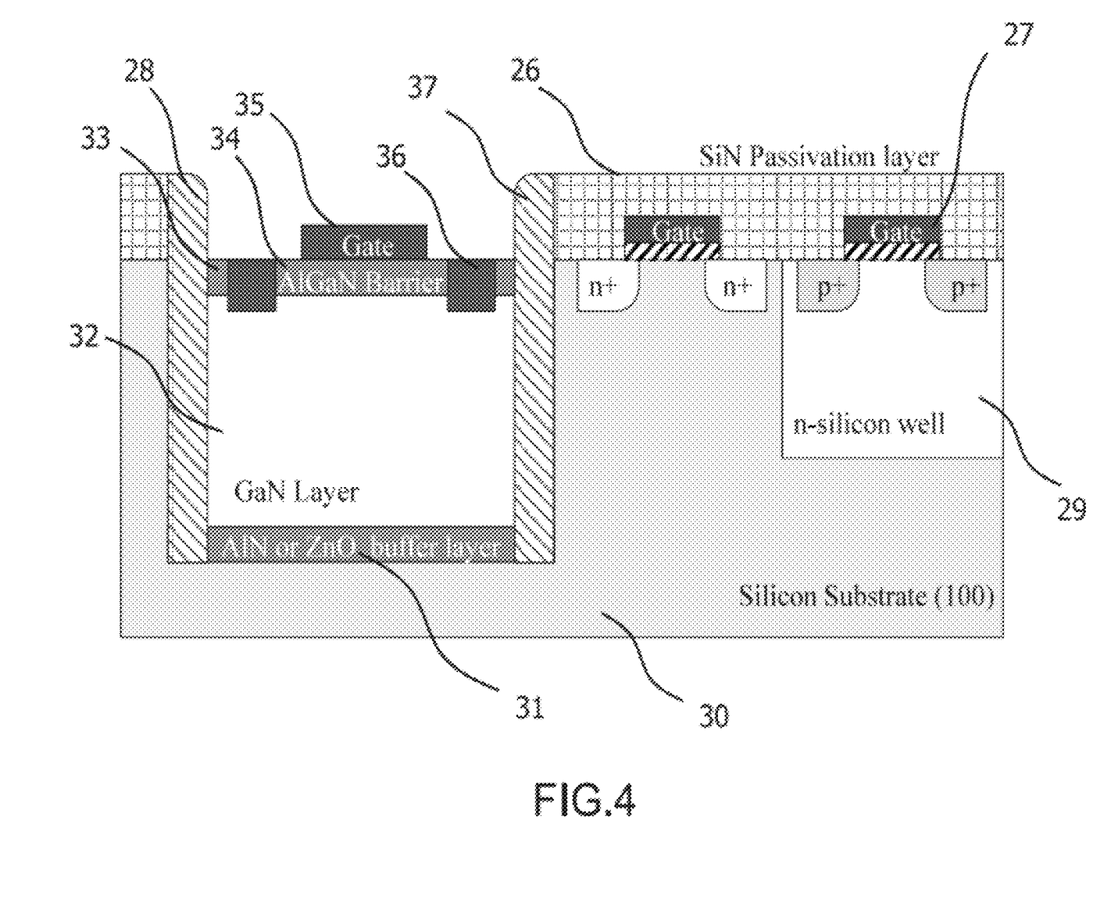
FIG. 4 shows a cross section view of a hybrid integrated circuit according to the preferred embodiment of the invention, where an insulating layer has been added along the sidewalls of the silicon trench.

As shown in FIG. 4, lateral insulating layers (37 and 38) can be deposit on the sidewalls of the trench before the nucleation buffer formation, in order to further reduce the possibility of cross contamination and to improve the electrical insulation between the III-V material and the Silicon substrate. This insulating layer can be obtained for example by depositing a second SiN layer after the trench formation and by removing, through an anisotropic etch, the SiN layer from the bottom of the trench. Another possibility is to form the silicon trench before the SiN passivation and perform a selective anisotropic etch to remove the SiN only from the bottom of the trench.

As mentioned above, numerous different buffer layers can be used for insertion between the substrate and the GaN layer to relieve the lattice strain and thus improve GaN crystal quality. ZnO has previously been tested as a buffer layer for Hydride Vapor Phase Epitaxy (HVPE) growth of GaN on sapphire. GaN growth on ZnO/Si structures has also been reported in literature. In general, the use of a ZnO buffer layer produces good quality GaN on both Si and sapphire substrates, even though ZnO is known to be thermally unstable at the high growth temperature of GaN. For ZnO/Si, no continuous two-dimensional GaN layer can be obtained without first growing a low temperature GaN buffer layer to prevent the thermal decomposition of ZnO. Experiment of HVPE grown GaN films on ZnO/sapphire without this low temperature GaN buffer layer exhibited cracks and peeling when thick (about 200 nm, or more) ZnO buffer layer were grown.

The thickness of the ZnO layer can be 200 angstroms, or less. For example, the ZnO thickness can be 100 angstroms. However, ZnO buffer layers which are at least 200 angstroms have been found to produce better crystal quality. The ZnO layer can be doped. For example, Al, B or Ga can be used to n-type dope the ZnO layer. ZnO can be deposited at a temperature lower than 600° C., such as 560° C. Using a textured ZnO film as a scaffold to set the texture of the subsequent GaN layer, and controlling the energy of the deposited Ga and N atoms in the pulsed laser deposition (PLD) process to grow textured GaN films. The texture controlled ZnO layer is expected to serve not only as a buffer layer but also as a template to set the texture of GaN films deposited on top of a ZnO layer.

Figure 5:
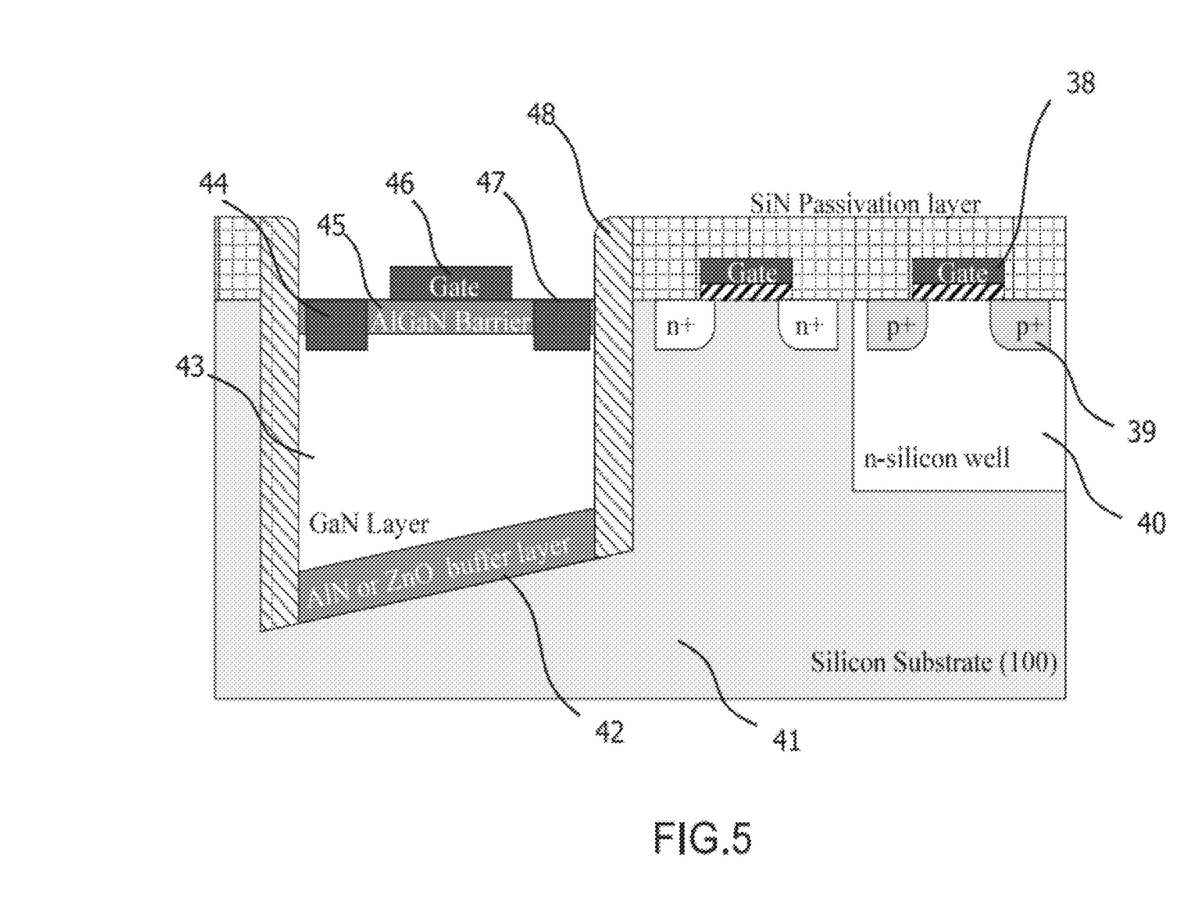
FIG. 5 shows a cross section view of a hybrid integrated circuit according to a further embodiment of the invention, where the bottom surface of the trench has been shaped in order to optimize the grown direction of the buffer layer.
Figure 6:
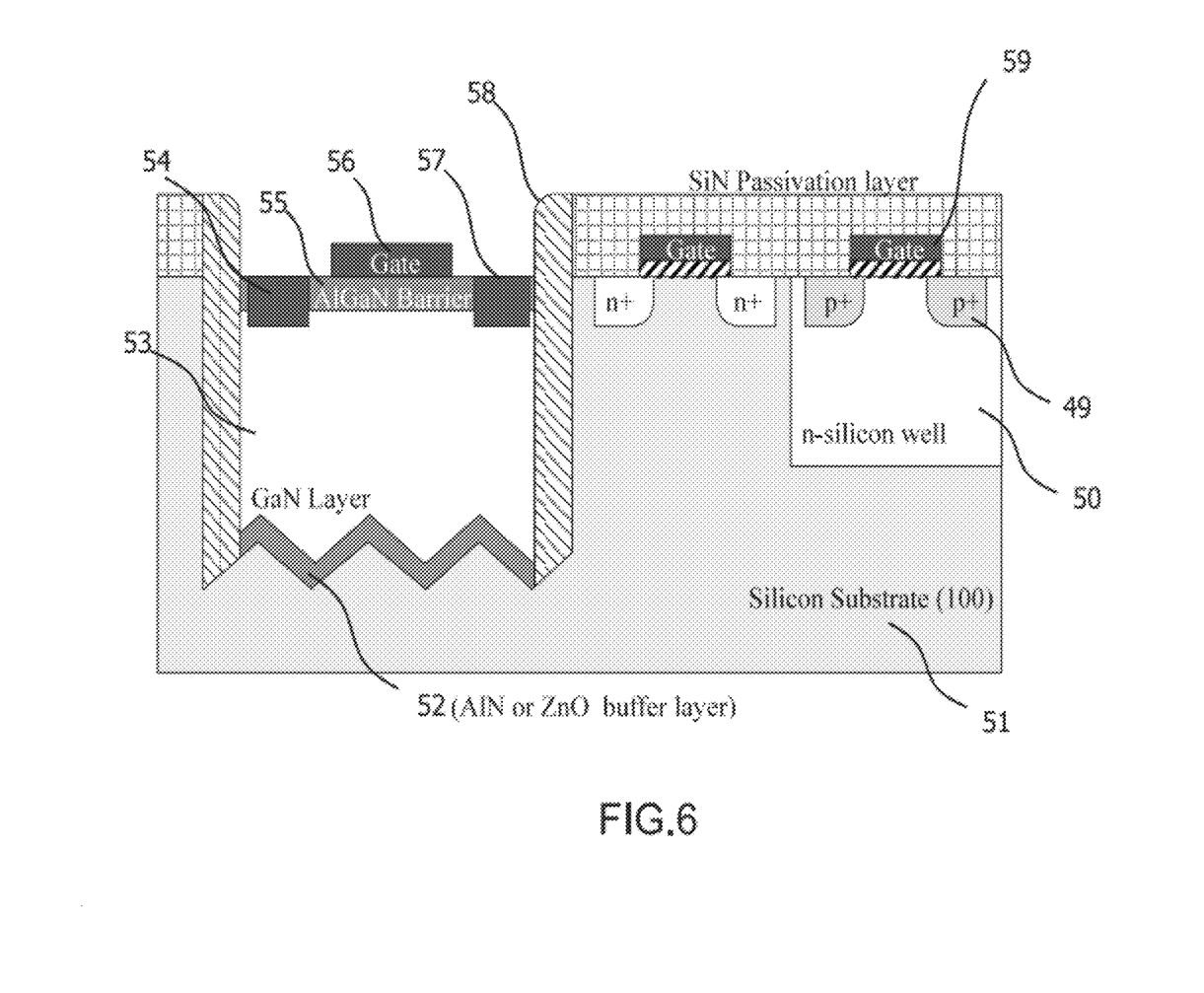
FIG. 6 shows a cross section view of a hybrid integrated circuit according to a further embodiment of the invention, where the bottom surface of the trench has been patterned with grooves, in order optimize the grown direction of the buffer layer.

Another possible configuration of the present invention is illustrated in FIG. 5, where the bottom of the trench has been shaped in order to guarantee a better GaN crystallography and defect free material. This result can be obtained in different ways. One possibility is to misorient the wafer towards the [011] direction before the trench formation. A similar result can be obtained forming grooves at the bottom of the trench as illustrated in FIG. 6. The grooves have side faces with a crystal orientation suitable for the growth of the GaN heterostructure. In both cases, the GaN growth is executed on an optimized growth surface (for example with a (111) orientation), improving the crystallographic quality of the compound material.

As well known to anyone skilled in the art, many additional layers can be added between the nucleation layer and the GaN buffer layer in order to improve the GaN quality. For instance, a transition layer of AlGaN with a gradual molar fraction can significantly improve the GaN growth process. Furthermore, in the case where the Silicon surface orientation at the bottom of the trench has been optimized for Nitride material growth, the GaN layer can be also grown directly on the Si substrate without using buffer layers.

As mentioned above, similar approaches as the ones discussed above can be adopted for any III-V material. For example in FIG. 7, a Germanium (Ge) or SiGe buffer layer 73 is used to grow GaAs devices on Silicon substrate. As far as the CMOS devices are processed before the III-V devices, the cross-contaminations between the two technologies is very limited.

The materials used in the fabrication process of the previous structures can comprise any type of semiconductor material, including II-VI compound semiconductors, III-V polar (such as GaN, AlN, InN etc. and their alloys) and non polar (such as GaAs, AlAs, InAs etc. and their alloys) materials, etc. In the case where polar materials such as III-Nitride materials are used, particularly attention must be paid to the molar fraction and the doping profiles used in the different layers forming the device. Extra layers can be also added to the structure in order to improve the device performance. Furthermore, in all the embodiments discussed above, the silicon substrate can be replaced with a semiconductor substrate comprising at least one of the materials belonging to the group comprising polar and non-polar III-V compounds semiconductors solar and non-solar II-VI compounds semiconductors, and semiconductors materials comprising elements of the IV group of the periodic table.

It is therefore a purpose of the present invention to describe a novel hybrid integrated circuit that offers the advantage of combining different semiconductor technologies with high density, minimizing the possibility of cross-contamination between the different technologies adopted during the manufacturing process.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

FIG. 1 is showing a cross section view of a hybrid integrated circuit according to a first embodiment of the invention. In this example a CMOS circuit 1 constituted by a re-channel and a p-channel MOSFET, has been co-integrated with a GaN HEMT device 11. The fabrication process of this embodiment includes the following steps: 1) the CMOS circuitry is manufactured in a first Silicon area until the metallization process step; 2) a passivation layer is grown all over the wafer; 3) a trench is formed in a second semiconductor area, using a selective etch; 3) An AlN or ZnO nucleation or buffer layer is formed on the bottom of the silicon trench; 4) A GaN layer is grown through one or more low temperature growth process steps on the top of the nucleation layer.

Once the GaN layer has been grown, one or more devices can be formed in the III-V region using one or more of the several well known GaN device structures such as enhancement or depletion HEMTs in single, multichannel or multi-gate configuration. InGaN layers can be added to improve the device performance, or just an AlGaN barrier layer can be grown on the top of the GaN buffer in order to obtain a basic HEMT structure as shown in figure.

Once the fabrication of the III-V devices has been completed (aside the metallization of the contacts), the Nitride layers formed on the top of the CMOS region, can be removed using a simple selective etch. Subsequently, the metallization and the contact formation steps can take place on the resulting planar structure.

The source and drain regions 8 and 12 may or may not extend down through the barrier as shown in FIG. 1. Furthermore, they can be also formed above the first barrier layer instead of extending down into the channel as illustrated in figure. However, this last solution, even if easier with respect to the illustrated one from a process view point, increases the contacts resistance in the device.

Starting from the basic concept structure of FIG. 1, an unlimited number of modifications can be adopted depending on the materials used, in order to optimize the device performance. Supply carrier layers and/or barrier layers can be added to the device.

B FIG. 2

In FIG. 2 is depicted a key fabrication step of the first embodiment of the invention, in which the CMOS circuitry 14 has been passivated and the wafer is ready to begin the co-integration phase with the III-V materials. At this point, all the high temperature process steps concerning the fabrication of the CMOS circuit have been accomplished and only the metal vias are left to be formed.

C FIG. 3

In FIG. 3 a SiN etch followed by a silicon etch has been performed to the semiconductor structure reported in FIG. 2, in order to allow the formation of the semiconductor trench that will accommodate the III-V material layer. As mentioned above the fabrication of the III-V device in this trench will decrease the silicon area exposed to the possible cross-contamination between the different materials, leading also to an improved planarization of the hybrid integrated circuit.

D FIG. 4

FIG. 4 is depicting a cross section view of a hybrid integrated circuit according to the preferred embodiment of the invention, where an insulating layer has been added along the sidewalls of the silicon trench in order to further reduce the possibility of cross contamination and to improve the electrically insulation of the III-V material from the Silicon substrate. This insulating layer can be obtained for example by depositing a second SiN layer after the trench formation and, through an anisotropic etch, removing the SiN layer from the trench bottom. Another possibility is to form the silicon trench before the SiN passivation and perform a selective anisotropic etch to remove the SiN only from the bottom of the trench.

E FIG. 5

FIG. 5 shows a cross section view of a hybrid integrated circuit according to a further embodiment of the invention, where the bottom surface of the trench has been shaped in order to optimize its surface orientation for the growth of the buffer layer. This result can be obtained in different ways. One possibility is to misorient the wafer towards the [011] axes before the trench formation. The GaN growth is therefore executed on an optimized growth surface, improving the crystallographic quality of the GaN layer.

F FIG. 6

Another possible solution is to form grooves at the bottom of the trench as illustrated in FIG. 6. The grooves have side faces with a crystal orientation suitable for the growth of the GaN heterostructure. Also in this case, the GaN growth is executed on an optimized growth surface (for example with a (111) orientation), improving the crystallographic quality of the compound material.

G FIG. 7

Figure 7:
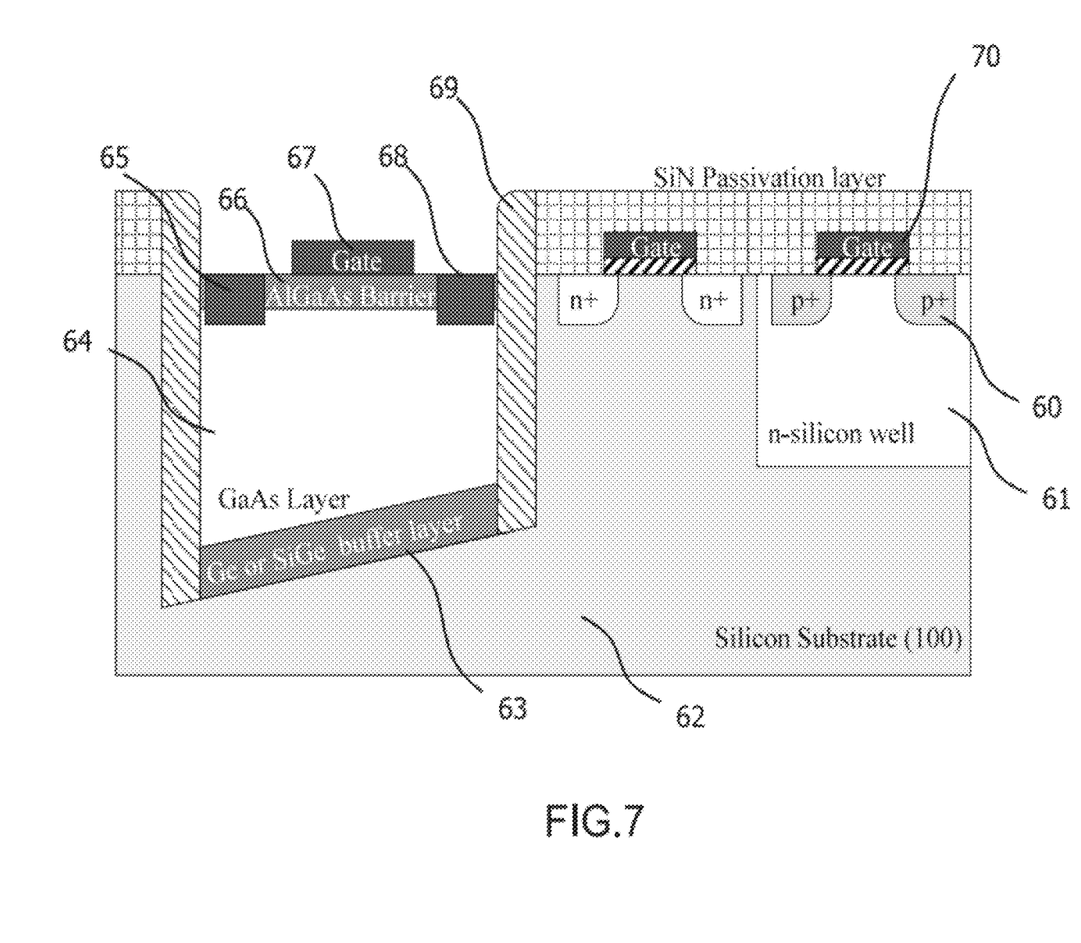
FIG. 7 shows a cross section view of a hybrid integrated circuit according to a further embodiment of the invention, where the III-V material is composed by GaAs, and the buffer layer is in Ge or SiGe.

One of the approaches described above can be adopted for any III-V material. In FIG. 7, a Germanium (Ge) or SiGe buffer layer is used to grow GaAs devices on Silicon substrate. As far as the CMOS devices are processed before the III-V devices, the cross contaminations between the two technologies are very limited.

The materials used in the fabrication process of the structures discussed herein, can comprise any type of semiconductor materials, including II-VI semiconductor compound, III-V polar (such as GaN, AlN, InN etc. and their alloys) and non polar (such as GaAs, AlAs, InAs etc. and their alloys) materials. In the case where polar materials such as III-Nitride materials are used, particular attention must be paid to the molar fraction and the doping profiles used in the different layers forming the device. Extra layers can be also added to the structure in order to improve the device performance.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A hybrid integrated circuit comprising:
   a semiconductor substrate layer;
   wherein said semiconductor substrate layer has a (100) orientation;
   at least a first semiconductor region formed in a first portion of said semiconductor substrate layer;
   at least a CMOS integrated circuit formed at least partially in said first semiconductor region;
   a semiconductor trench formed in a second portion of said semiconductor substrate layer;
   a buffer layer formed above at least a portion of a bottom side of said semiconductor trench;
   at least a second semiconductor region in said semiconductor trench formed above said buffer layer;
   wherein said second semiconductor region is comprising at least a first and a second compound semiconductor layers;
   wherein said second semiconductor region is formed above and in physical contact with said buffer layer;
   wherein said first compound semiconductor layer forms an hetero-junction with said second compound semiconductor layer;
   wherein the energy gap of said first compound semiconductor layer is greater than the energy gap of said second compound semiconductor layer;
   at least a semiconductor hetero-structure transistor device formed in said second semiconductor region;
   wherein said first semiconductor region is made of a semiconductor material comprising elements of the IV group of the periodic table;
   wherein an upper and a lower surface of said buffer layer have substantially the same shape;
   wherein said buffer layer is interposed between said second semiconductor region and the bottom side of said semiconductor trench so as to physically separate said second semiconductor region and said semiconductor device from the bottom side of said semiconductor trench;
   wherein said buffer layer is made of a material belonging to the group comprising AlN, Ge, SiGe and ZnO;
   wherein at least one of said at least one semiconductor device comprises at least one of the materials belonging to the group comprising polar and non-polar III-V compounds semiconductors, polar and non-polar II-VI compounds semiconductors materials, and
   wherein said CMOS integrated circuit is at least partially covered with a protective layer; and
   wherein at least one of said at least one semiconductor hetero-structure transistor device is a power transistor, and said CMOS integrated circuit comprises a control CMOS circuit of said power transistor.

2. The hybrid integrated circuit of claim 1, wherein an insulating layer is formed along at least one side-wall of said semiconductor trench.

3. The hybrid integrated circuit of claim 1, wherein said semiconductor substrate layer is comprising a buried insulating layer.

4. The hybrid integrated circuit of claim 1, wherein at least a portion of a lower surface of said semiconductor trench is shaped such as to have a crystallographic orientation suitable for the formation of said compound semiconductor layer.

5. The hybrid integrated circuit of claim 1,
   wherein said semiconductor trench is provided with at least one groove, and
   wherein at least one of said at least one groove is provided with side faces having an orientation suitable for the formation of said compound semiconductor layer.

* * * * *